United States Patent [19]

Muramatsu

[11] 4,369,565

[45] Jan. 25, 1983

[54] METHOD OF MANUFACTURING A SEMICONDUCTOR DEVICE UTILIZING ETCH AND REFILL TO FORM ISOLATION REGIONS

[75] Inventor: Akira Muramatsu, Tokyo, Japan

[73] Assignee: Hitachi, Ltd., Tokyo, Japan

[21] Appl. No.: 179,983

[22] Filed: Aug. 21, 1980

[30] Foreign Application Priority Data

Aug. 31, 1979 [JP] Japan .................. 54-110423

[51] Int. Cl.³ .................. H01L 21/283; H01L 21/76
[52] U.S. Cl. .................. 29/580; 29/577 R; 29/578; 29/590; 29/591; 148/174; 148/175; 148/187; 156/643; 156/648; 156/657; 156/662; 357/50; 357/59
[58] Field of Search .................. 29/577, 578, 580, 590, 29/591; 156/643, 648, 653, 657, 662; 148/174, 175, 187; 357/49, 50, 59, 55

[56] References Cited

U.S. PATENT DOCUMENTS

| | | | |
|---|---|---|---|
| 3,500,139 | 3/1970 | Frouin et al. | 357/49 X |
| 3,911,562 | 10/1975 | Youmans | 29/580 X |
| 4,048,649 | 9/1977 | Bohn | 357/50 X |
| 4,187,516 | 2/1980 | Legat et al. | 357/49 X |
| 4,225,879 | 9/1980 | Vinson | 357/55 |
| 4,233,091 | 11/1980 | Kawabe | 148/174 X |
| 4,252,579 | 2/1981 | Ho et al. | 148/174 |

FOREIGN PATENT DOCUMENTS

| | | | |
|---|---|---|---|
| 54-589 | 1/1979 | Japan . | |
| 54-32984 | 3/1979 | Japan . | |
| 55-50636 | 12/1980 | Japan | 148/174 |

OTHER PUBLICATIONS

Sanders et al., "Improved Dielectric-Junction Combination Isolation...," IEEE I.E.D. MTG, Tech. Digest, (Dec. 1973), pp. 38-40.

*Primary Examiner*—L. Dewayne Rutledge
*Assistant Examiner*—W. G. Saba
*Attorney, Agent, or Firm*—Antonelli, Terry & Wands

[57] ABSTRACT

A method of manufacturing a semiconductor device characterized in that after a fine groove has been formed in the surface of a semiconductor layer by dry etching, an insulating region is formed so as to fill up the fine groove.

12 Claims, 16 Drawing Figures

METHOD OF MANUFACTURING A SEMICONDUCTOR DEVICE UTILIZING ETCH AND REFILL TO FORM ISOLATION REGIONS

BACKGROUND OF THE INVENTION

This invention relates to a method of manufacturing a semiconductor device. More particularly, it relates to a method of forming an isolation region of the dielectric isolation type at a small width.

As the method of forming the isolation region of this type, there has heretofore been proposed a method wherein after forming a groove of V-shaped section in the surface of a semiconductor layer by the anisotropic etching, an insulating region (for example, a region consists of an insulating film and a polycrystalline silicon layer) is formed so as to fill up the groove. This method, however, has the disadvantage that since the open area of the V-shaped groove is considerably large, an enhancement in the density of integration is hindered.

BRIEF SUMMARY OF THE INVENTION

A first object of this invention is to provide a novel method of forming an isolation region as is free from the disadvantage described above.

A second object of this invention is to provide a method of manufacturing a semiconductor device as employs the novel method of forming an isolation region.

DESCRIPTION OF THE PREFERRED EMBODIMENTS

Figure 1:
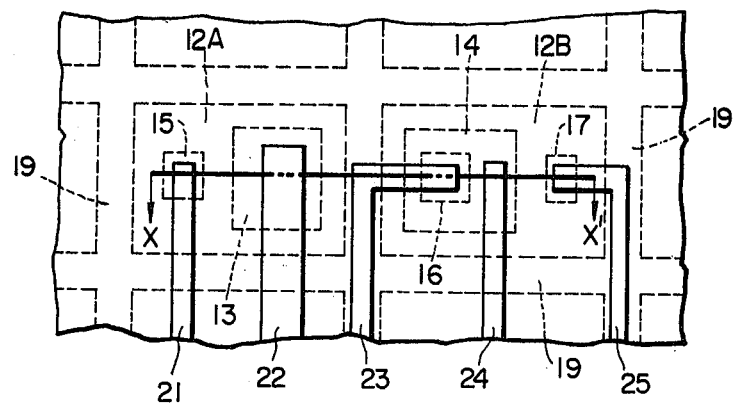
FIG. 1 is a plan view showing a semiconductor device which has been formed in accordance with an embodiment of this invention.

FIG. 1 is a view showing the top plan of a semiconductor device which has been formed in accordance with an embodiment of this invention. As shown in the figure, a plurality of semiconductor island regions are defined by a fine groove 19. In each of the island regions 12A and 12B, a PN-junction type diode and an NPN-type transistor are formed. Numerals 13 and 14 designate P-type semiconductor regions, and numerals 15, 16 and 17 designate N+-type semiconductor regions.

Figure 2:
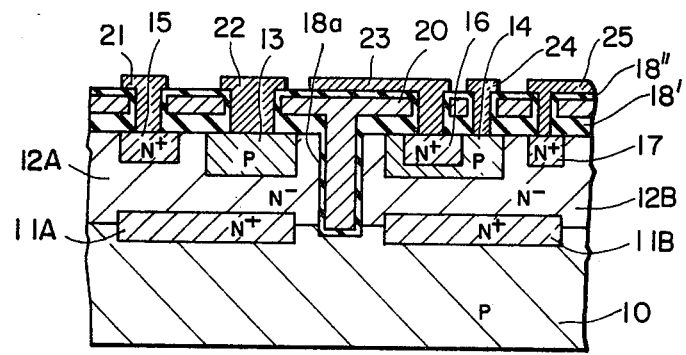
FIG. 2 is a sectional view taken along X—X' in FIG. 1, FIGS. 3a to 3e are sectional views showing various steps of a method of manufacturing the semiconductor device according to the embodiment of this invention.

FIG. 2 is a sectional view of the semiconductor device shown in FIG. 1 as taken along line X—X'. Referring to the figure, an N⁻-type epitaxial layer 12 is formed on a P-type semiconductor substrate 10, and N+-type buried layers 11A and 11B are formed between the epitaxial layer 12 and the P-type substrate 10. The groove 19 is formed in a manner to extend from the surface of the epitaxial layer down to the P-type substrate 10, and an SiO$_2$ film 18a is formed on the surface of the groove 19. The epitaxial layer 12 is isolated into the two semiconductor island regions 12A and 12B by the groove 19. Further, a polycrystalline silicon layer is buried in the groove 19. The polycrystalline silicon layer extends from within the groove onto the surfaces of the island regions 12A and 12B. The P-type region 13 is formed in the surface of the island region 12A, and this region 13 and the N⁻-type island region 12A constitute the PN-junction type diode. The N+-type region 15 is an electrode leading-out region for forming an electrode on the island region 12A. The P-type region 13 is formed with an electrode 22, and the N+-type region 15 with the electrode 21. The P-type base region 14 is formed in the surface of the island region 12B, and the N+-type emitter region 16 is formed within this region 14. The N+-type region 16, the P-type region 14 and the N⁻-type region 12B constitute the NPN-type transistor. The N+-type region 17 is an electrode leading-out region for connecting an electrode to the N⁻-type collector region 12B. The N+-type buried layer 11B at a high impurity concentration lowers the internal resistance of the N⁻-type collector region 12B. The N+-type region 16 is formed with an electrode 23, and the P-type region 14 with an electrode 24. The N+-type region 17 is formed with the electrode 25. An SiO$_2$ film 18'' is formed on the surface of a polycrystalline layer which overlies the island regions 12A and 12B.

FIGS. 3a to 3e show manufacturing steps of the semiconductor device illustrated in FIGS. 1 and 2. The manufacturing steps of the semiconductor device will now be described with reference to FIGS. 3a to 3e.

Figure 3A:
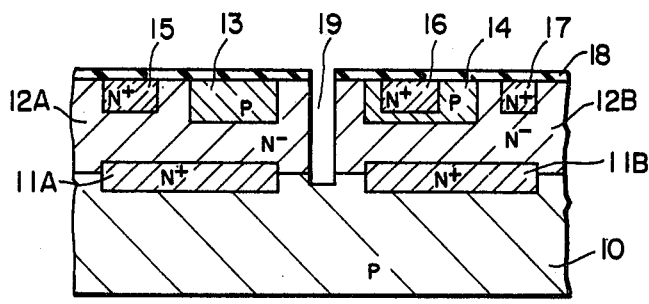

(a) First, as shown in FIG. 3a, on the surface of the semiconductor substrate 10 made of P-type silicon, the silicon layer 12 of the N⁻-type (having a resistivity of approximately 0.5 Ωcm) is epitaxially grown to a thickness of approximately 8 μm unitarily through the N+-type buried layers 11A and 11B. Thereafter, the P-type semiconductor regions 13 and 14 are simultaneously formed in the N⁻-type layer 12 by the selective diffusion. Further, the N+-type semiconductor regions 15 and 17 and the N+-type semiconductor region 16 are simultaneously formed in the N⁻-type layer 12 and the P-type semiconductor region 14 by the selective diffusion respectively. By way of example, the P-type semiconductor region 13 and the N⁻-type silicon layer 12A constitute the PN-junction type diode, while the N+-type semiconductor region 16, the P-type semiconductor region 14 and the N⁻-type silicon layer 12B constitute the NPN-type transistor. The N+-type regions 15 and 17 are regions for establishing ohmic contacts. In the above processing of the selective diffusion, an SiO$_2$ film 18 formed after the epitaxial growth processing is used as a selective mask.

After the circuit elements such as diode and transistor have been formed by the selective diffusion, a photoresist film is formed on the SiO$_2$ film 18. Using the photoresist film as a mask, the groove 19 which surrounds the P-type region 13 as well as the N+-type region 15 and the P-type region 14 as well as the N+-type region 17 and which reaches the P-type substrate 10 is formed by the sputter etching. As an example, the groove 19 is formed to be 2 μm wide and 9 μm deep. The N⁻-type silicon layer 12 is isolated into the island regions 12A and 12B by the groove 19.

Figure 3B:
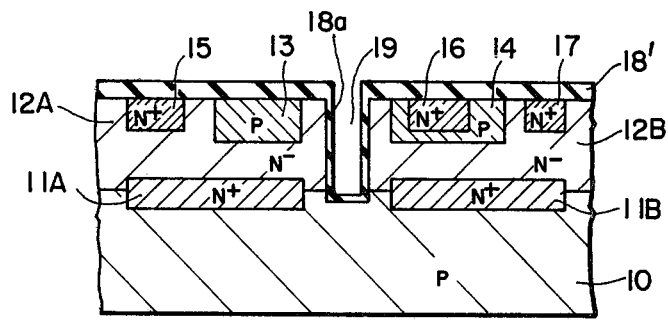

(b) Subsequently, as shown in FIG. 3b, the surface passivation is carried out to form the SiO$_2$ film 18a of a thickness of approximately 2,000 Å on the surface of the groove 19 and to simultaneously turn the SiO$_2$ film 18 on the upper surface of the resultant substrate into a thick SiO$_2$ film 18'.

Figure 3C:
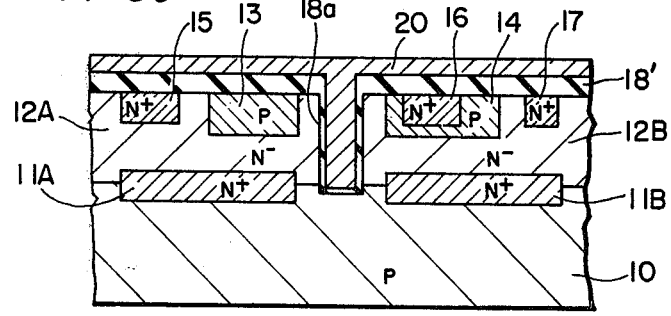

(c) Thereafter, as shown in FIG. 3c, an impurity-doped polycrystalline layer 20 which is approximately 1 μm thick is deposited on the whole surface of the substrate by the CVD (chemical vapor deposition) process. In this case, the polycrystalline silicon layer 20 exhibits a good step coverage and therefore fills up the groove 19 completely. In consequence, a polycrystalline silicon layer the upper surface of which is flat is formed.

Figure 3D:
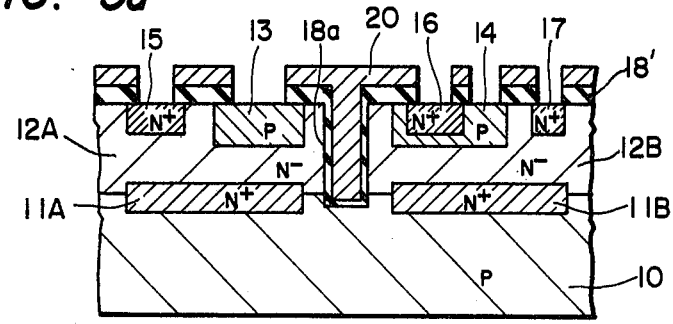

(d) Subsequently, as shown in FIG. 3d, the polycrystalline silicon layer 20 and the underlying SiO$_2$ film 18' are selectively etched and removed so as to expose the respective contact parts of the P-type semiconductor regions 13 and 14 and the N$^+$-type semiconductor regions 15, 16 and 17.

Figure 3E:
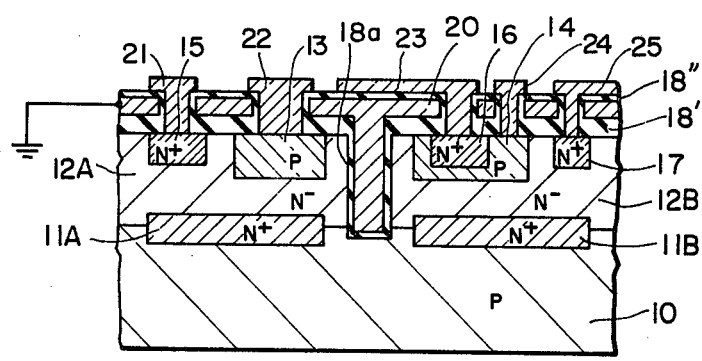

(e) Thereafter, as shown in FIG. 3e, the exposed surface of the polycrystalline silicon layer 20 is oxidized to form the thin SiO$_2$ film 18''. The electrodes 22 and 24 are respectively formed on the P-type semiconductor regions 13 and 14, and the electrodes 21, 23 and 25 are respectively formed on the N$^+$-type semiconductor regions 15, 16 and 17. When the thin SiO$_2$ film 18'' is formed, a very thin SiO$_2$ film is sometimes formed on the exposed parts of the respective regions 13-17 at the same time. In that case, the very thin SiO$_2$ film is etched and removed, whereupon the electrode layers 21, 22, 23, 24 and 25 are formed so as to lie in ohmic contact with the respectively corresponding regions 15, 13, 16, 14 and 17. The polycrystalline silicon layer 20 is grounded as illustrated in FIG. 3e. Such grounding can bring forth an electrical shield function, and becomes a perfect countermeasure against charge leakage from the electrodes, etc. The ground potential may be the lowest potential. In addition, one grounded place suffices. The reason is that the polycrystalline silicon layer is continuously formed on the surfaces of the island regions 12A and 12B, so the whole polycrystalline silicon layer is put into the ground potential by grounding at least one place. The polycrystalline silicon layer 20 may well be put into a floating state in potential. In this case, a surface protecting function for the semiconductor device is effected.

According to the above embodiment, there can be formed the isolation region which is made of the polycrystalline silicon layer packed in the groove 19 through the SiO$_2$ film 18a and which has a very small width of approximately 2 μm. Moreover, the upper surface of this isolation region is flat, so that a flat interconnection can be formed on the isolation region as the electrode layer 23 in FIG. 3e. Accordingly, a disconnection ascribable to a stepped structure can be prevented from occurring.

In the embodiment, the polycrystalline silicon layer 20 may be a non-doped polycrystalline silicon layer as well. In addition, it may well be formed by the epitaxial growth (EPi growth). Further, the SiO$_2$ film 18'' functioning as an inter-layer insulating film can also be replaced with one or more of other insulating films, for example, an SiO$_2$ film, a PSG (phosphosilicate glass) film and an Si$_3$N$_4$ film formed by the CVD process and a glass film formed by the SOG (spin-on-glass) process.

Figure 4:
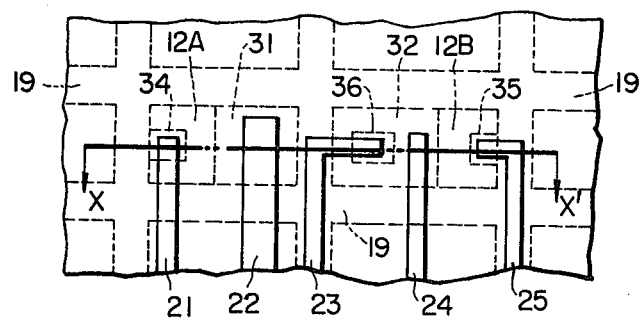
FIG. 4 is a plan view of a semiconductor device which has been formed in accordance with another embodiment of this invention.

FIG. 4 is a plan view of a semiconductor device which has been formed in accordance with another embodiment of this invention. The same parts as in FIG. 1 are indicated by the same symbols. In FIG. 4, the PN-junction type diode and the NPN-type transistor are formed in each of the semiconductor island regions 12A and 12B enclosed with the fine groove 19. FIGS. 5a to 5g illustrate manufacturing steps of the semiconductor device shown in FIG. 4. The same parts as in FIGS. 3a to 3e are indicated by the same symbols. Referring now to FIGS. 5a to 5g, a method of manufacturing the semiconductor device according to the other embodiment of this invention will be described.

Figure 5A:
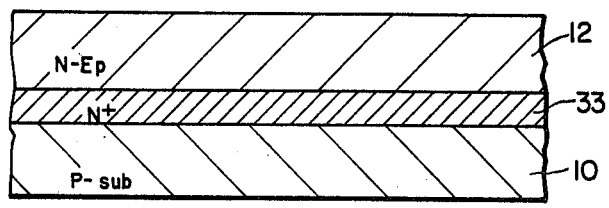
FIGS. 5a to 5g are sectional views showing various steps of a method of manufacturing the semiconductor device according to the embodiment of this invention in FIG. 4.

(a) As shown in FIG. 5a, the N$^-$-type epitaxial layer 12 is formed on the P-type substrate 10 through an N$^+$-type buried layer 33.

Figure 5B:
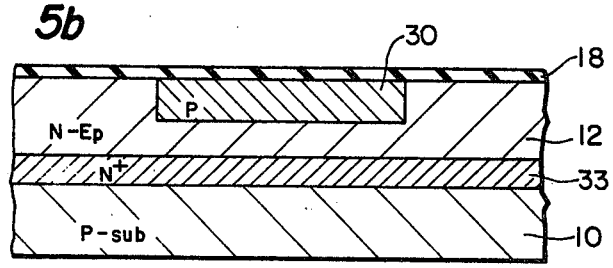

(b) Subsequently, as shown in FIG. 5b, a P-type semiconductor region 30 is formed in a selected part of the surface of the epitaxial layer 12.

Figure 5C:
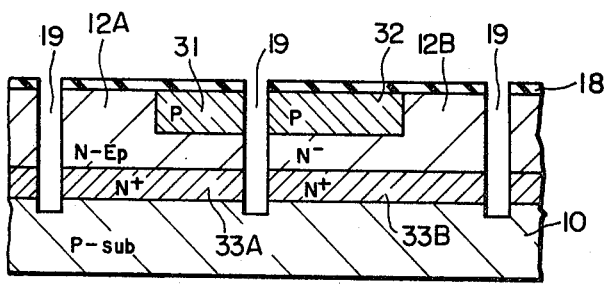

(c) As shown in FIG. 5c, the fine groove 19 which extends down to the P-type substrate 10 through the P-type semiconductor region 30 is formed by the sputter etching. By the formation of the groove 19, the P-type region 30 is divided into two P-type regions 31 and 32. Similarly, the N$^+$-type buried layer 33 is divided into two N$^+$-type regions 33A and 33B.

Figure 5D:
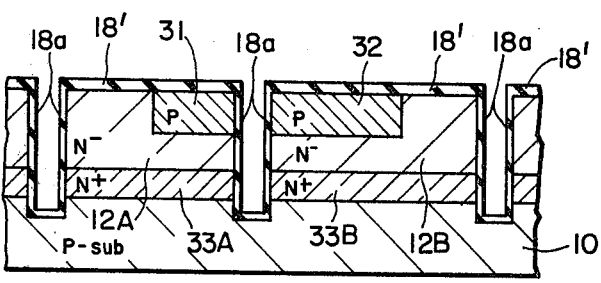

(d) As shown in FIG. 5d, the SiO$_2$ film 18a is formed on the surface of the groove 19 by the oxidation. Simultaneously therewith, the SiO$_2$ film 18 on the surfaces of the P-type regions 31 and 32 and the N$^-$-type island regions 12A and 12B turns into the thick SiO$_2$ film 18'.

Figure 5E:
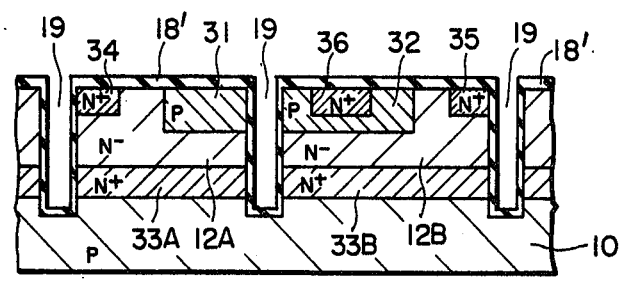

(e) As shown in FIG. 5e, N$^+$-type semiconductor regions 34, 35 and 36 are respectively formed in selected parts of the N$^-$-type island regions 12A and 12B and the P-type region 32.

Figure 5F:
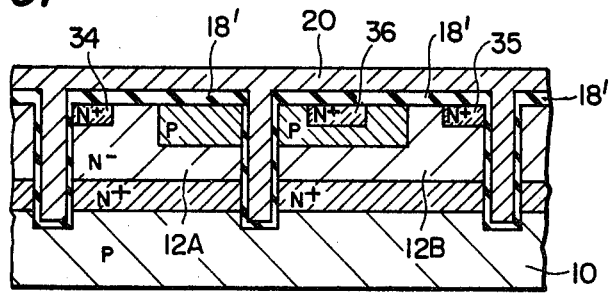

(f) As shown in FIG. 5f, the polycrystalline silicon layer 20 doped with an impurity is formed in the groove 19 and on the SiO$_2$ film 18' to a thickness of approximately 1 μm by the CVD process.

Figure 5G:
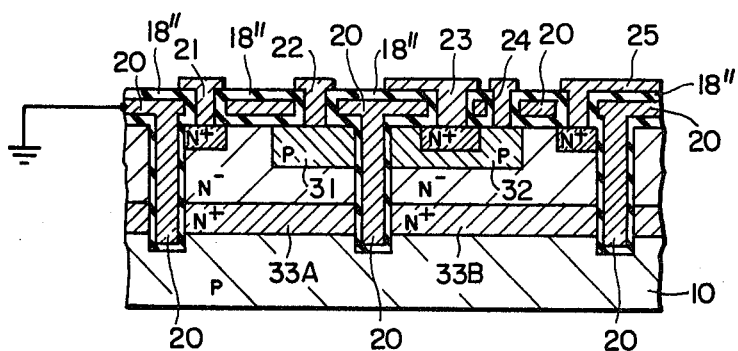

(g) As shown in FIG. 5g, selected parts of the polycrystalline silicon layer 20 and the underlying SiO$_2$ film 18' are removed to expose selected parts of the P-type regions 31 and 32 and the N$^+$-type regions 34, 35 and 36. The exposed surfaces of the polycrystalline silicon layer 20 are oxidized to form the thin SiO$_2$ film 18''. The electrodes 22 and 24 are respectively formed on the P-type regions 31 and 32, and the electrodes 21, 25 and 23 are respectively formed on the N$^+$-type regions 34, 35 and 36. The polycrystalline silicon layer 20 is connected to the ground potential. In the above embodiment, the P-type regions 31 and 32 and the N$^+$-type buried layers 33A and 33B can be self-aligned by the formation of the groove 19, and the density of integration can be enhanced still more.

Figure 6:
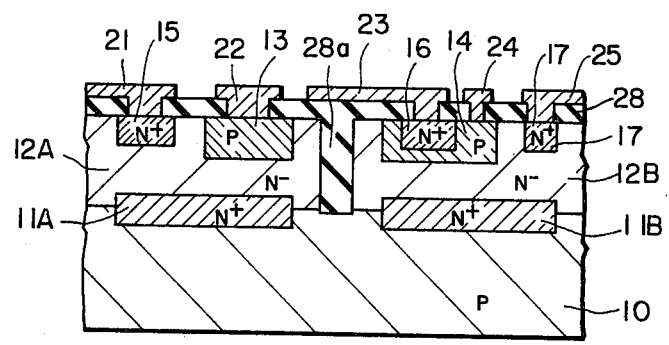
FIG. 6 is a sectional view of the essential portions of a semiconductor device according to still another embodiment of this invention.

FIG. 6 shows another embodiment of this invention. The same parts as in the semiconductor device shown in FIG. 2 are assigned the same symbols, and are not described repeatedly. The characterizing feature of the embodiment illustrated in FIG. 6 consists in that a passivation film 28 of SiO$_2$ is formed on the island regions 12A and 12B and in the groove 19 by the thermal oxidation process and/or the CVD process, thereby to form the isolation region of a part 28a of the SiO$_2$ film 28 as lies in the groove 19.

Even when constructed as described above, the isolation region can have its width limited sufficiently and have its upper surface flattened.

As set forth above, according to this invention, the narrow isolation region can be formed, which brings forth the effect that the enhancement of the density of integration can be achieved, and the upper surface of the isolation region can be flattened, which brings forth the effect that the disconnection fault can be prevented. Further, by grounding the polycrystalline silicon layer, it can be endowed with the shield function.

In this invention thus far described, the "sputter etching" signifies the inert sputter etching and the reactive sputter etching which are executed by the use of a parallel plate type plasma etcher. In accordance with the sputter etching, a fine groove which is 1-4 μm wide and 10 μm deep and which is U-shaped or rectangular in section can be precisely formed in the surface of, for example, a semiconductor silicon layer. The "isolation region" which is formed in such groove signifies a region which is entirely made up of an insulator such as SiO₂, a region in which a conductor layer such as polycrystalline silicon layer is stacked on an insulating film such as SiO₂ film, etc.

This invention is not restricted to the foregoing embodiments, but the following modifications are also applicable. The formation of the fine groove may well be carried out by any other dry etching, for example, the plasma etching, the ion etching or the laser beam etching. An etcher of the cylindrical type may well be employed.

What is claimed is:

1. A method of manufacturing a semiconductor device comprising the steps of:
    forming a semiconductor epitaxial layer on a semiconductor substrate;
    forming a groove extending from a main surface of said epitaxial layer into said semiconductor substrate through said epitaxial layer thereby to divide said epitaxial layer into at least two island parts;
    depositing a semiconductor layer on a first insulating film which is formed on the surface of said groove and on the surfaces of said island parts, thereby to fill said groove;
    selectively removing at least one portion of said semiconductor layer overlying each of said island parts thereby to form a plurality of holes in said semiconductor layer, corresponding to circuit elements formed in each of said island parts, and to provide a remaining semiconductor layer that continuously extends over said groove and said at least two island parts except for said plurality of holes;
    forming a second insulating film on the remaining surface of said semiconductor layer; and
    forming electrode layers for circuit elements formed in each of said island parts so as to extend over a surface of said second insulating film into the corresponding hole of said semiconductor layer.

2. A method of manufacturing a semiconductor device according to claim 1, wherein said groove is formed by dry etching.

3. A method of manufacturing a semiconductor device according to claim 1, wherein said semiconductor layer is formed by the CVD process.

4. A method of manufacturing a semiconductor device according to claim 1, wherein said semiconductor layer is a polycrystalline silicon layer.

5. A method of manufacturing a semiconductor device according to claim 1, wherein said epitaxial layer has one conductivity type opposite to said semiconductor substrate so as to electrically isolate said island parts from each other.

6. A method of manufacturing a semiconductor device according to claim 1, 2, 3, 4 or 5, wherein said semiconductor layer is connected to a fixed potential, whereby said semiconductor layer can act as an electrical shield.

7. A method of manufacturing a semiconductor device according to claim 6, wherein the fixed potential is ground.

8. A method of manufacturing a semiconductor device according to claim 7, wherein the semiconductor layer is connected in only one place.

9. A method of manufacturing a semiconductor device according to claim 6, wherein the semiconductor layer is connected in only one place.

10. A method of manufacturing a semiconductor device according to claim 1, wherein said semiconductor substrate is made of silicon having a conductivity of one type and said semiconductor epitaxial layer is made of silicon having a conductivity opposite to the conductivity of the substrate.

11. A method of manufacturing a semiconductor device according to claim 10, wherein the semiconductor layer is a polycrystalline silicon layer.

12. A method of manufacturing a semiconductor device according to claim 11, wherein the first and second insulating films are each of silicon oxide.

* * * * *